(12) United States Patent
Hwang

(10) Patent No.: US 6,729,905 B1
(45) Date of Patent: May 4, 2004

(54) TRANSCEIVER CAGE ASSEMBLY

(75) Inventor: Jenq-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/387,821

(22) Filed: Mar. 12, 2003

(51) Int. Cl.[7] .......................................... H01R 13/648
(52) U.S. Cl. ...................................................... 439/607
(58) Field of Search .................. 439/607, 79, 108, 439/939

(56) References Cited

U.S. PATENT DOCUMENTS

| | | | |
|---|---|---|---|
| 6,047,172 A | | 4/2000 | Babineau et al. |
| 6,066,001 A | | 5/2000 | Liptak et al. |
| 6,095,865 A | * | 8/2000 | Wu ............................ 439/607 |
| 6,430,053 B1 | | 8/2002 | Peterson et al. |
| 6,478,622 B1 | | 11/2002 | Hwang |
| 6,508,670 B1 | | 1/2003 | Hwang |
| 6,524,134 B2 | * | 2/2003 | Flickinger et al. .......... 439/607 |
| 6,558,191 B2 | * | 5/2003 | Bright et al. ............ 439/541.5 |

* cited by examiner

Primary Examiner—Tho D. Ta
(74) Attorney, Agent, or Firm—Wei Te Chung

(57) ABSTRACT

A shielding cage assembly (100) for shielding a plurality of transceiver modules (4) received therein includes a connecting cover (2) and a plurality of transceiver cages (1), and a plurality of bottom shields (9). The transceiver cages are arranged in parallel beneath the connecting cover. A plurality of retaining tabs (720a) extends from each transceiver cage to pass through corresponding slots (211) defined through the connecting cover. The connecting cover further includes a plurality of mounting pins (221) received in corresponding mounting holes (32) in a printed circuit board (3). The transceiver cages are received through an opening (31) in the printed circuit board. The bottom shields attach to the printed circuit board and to a corresponding transceiver cage to complete EMI shielding of the shielding cage assembly.

18 Claims, 5 Drawing Sheets

TRANSCEIVER CAGE ASSEMBLY

BACKGROUND OF THE INVENTION

1. Field of the Invention

This invention relates generally to a shielding cage and more particularly to a shielding cage assembly for arranging a plurality of small form-factor, pluggable (SFP) transceiver modules therein. This application is related to a copending application filed on Feb. 27, 2003 having the same applicant, the same assignee and the same title with the invention.

2. Description of the Related Art

A transceiver module is a discrete unit used in interface communications equipments, and is usually singly received in a cage, which provides shielding against electromagnetic interference (EMI). Prior art shielded transceiver modules are too difficult to assemble densely to a circuit board. Therefore, an improved, inexpensive shielding cage assembly that will allow transceiver modules to be easily and densely mounted on a printed circuit board is desired.

SUMMARY OF THE INVENTION

An object of the present invention is to provide a shielding cage assembly for retaining a plurality of transceiver modules therein, said shielding cage assembly being easily mountable to a printed circuit board, and providing all around each transceiver module.

A shielding cage assembly according to the present invention for shielding a plurality of transceiver modules received therein includes a connecting cover and a plurality of transceiver cages, and a plurality of bottom shields. The transceiver cages are arranged in parallel beneath the connecting cover. A plurality of retaining tabs extends from each transceiver cage to pass through corresponding slots defined through the connecting cover. The connecting cover further includes a plurality of mounting pins received in corresponding mounting holes in a printed circuit board. The transceiver cages are received through an opening in the printed circuit board. The bottom shields attach to the printed circuit board and to a corresponding transceiver cage to complete EMI shielding of the shielding cage assembly.

Other objects, advantages and novel features of the present invention will be drawn from the following detailed description of a preferred embodiment of the present invention, with attached drawings, in which:

DETAILED DESCRIPTION OF THE PREFERRED EMBODIMENT

Figure 1:
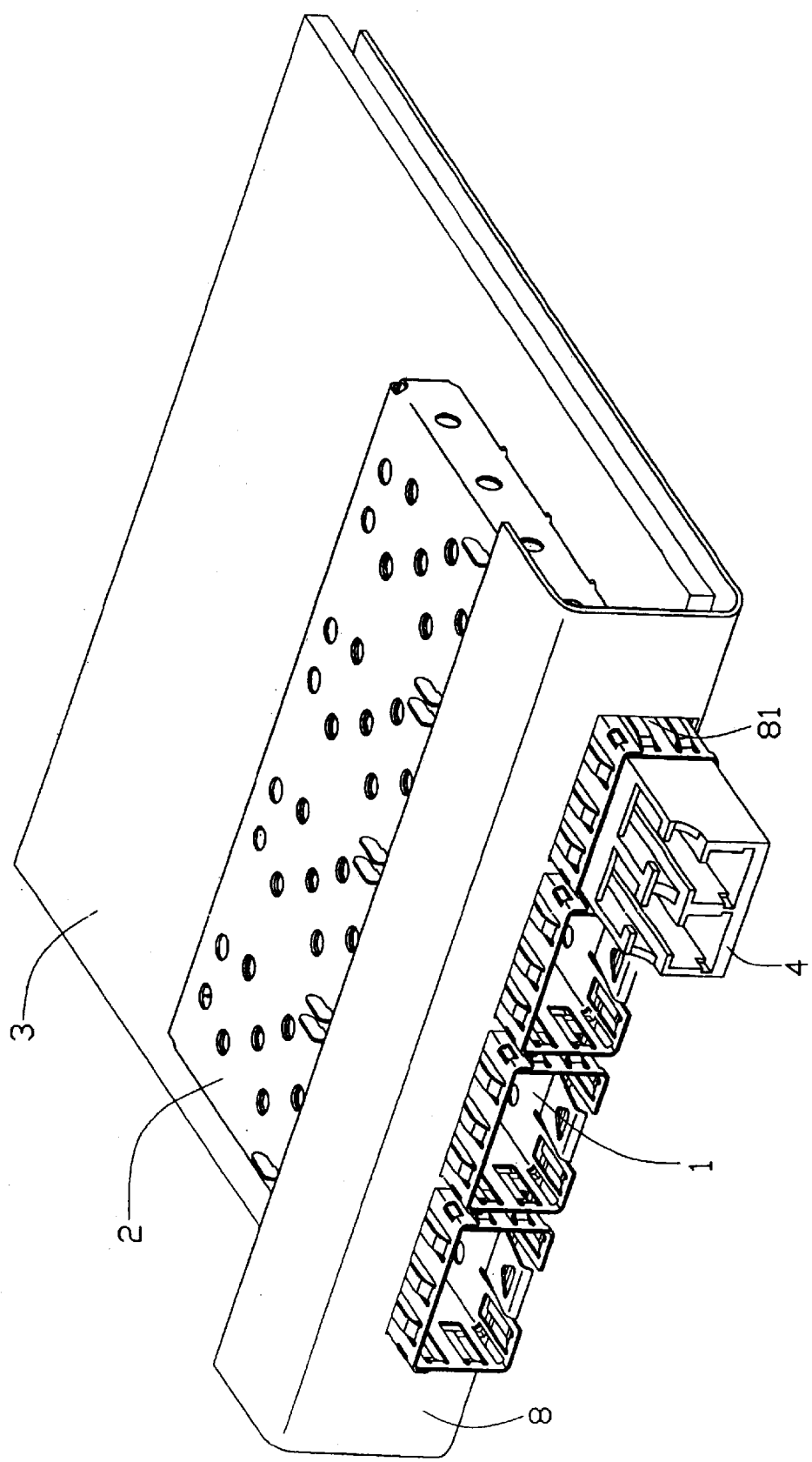
FIG. 1 is an assembled, perspective view of a shielding cage assembly in accordance with the present invention, mounted to a printed circuit board and protruding through a front panel.

Referring to FIGS. 1 to 4, a shielding cage assembly 100 in accordance with the present invention comprises a plurality of transceiver cages 1, a conductive connecting cover 2 and a plurality of bottom shields 9. The transceiver cages 1 are arranged in parallel and each respectively receives a corresponding transceiver module 4 therein. The connecting cover 2 engages with the transceiver cages 1 and is fixed to a printed circuit board 3. Each bottom shield 9 is fixed to a rear end of a bottom portion of a corresponding transceiver cage 1 and to the printed circuit board 3. A front panel 8 defining a plurality of windows 81 is fixed relative to the circuit board 3, and front ends of the transceiver cages 1 extend out of the windows 81.

Figure 4:
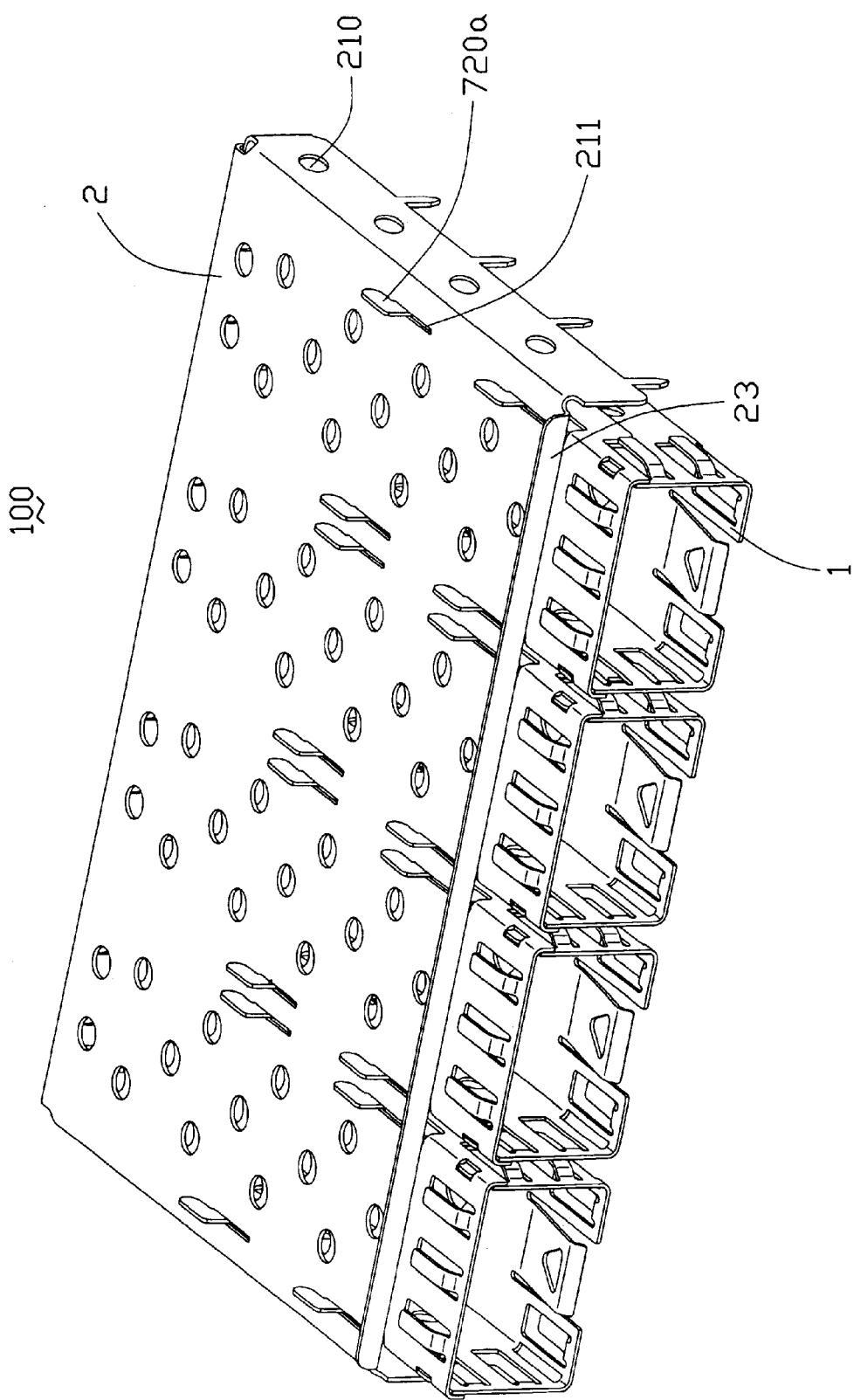
FIG. 4 is a perspective view of the shielding cage assembly of FIG. 1 from a top-side aspect.
Figure 5:
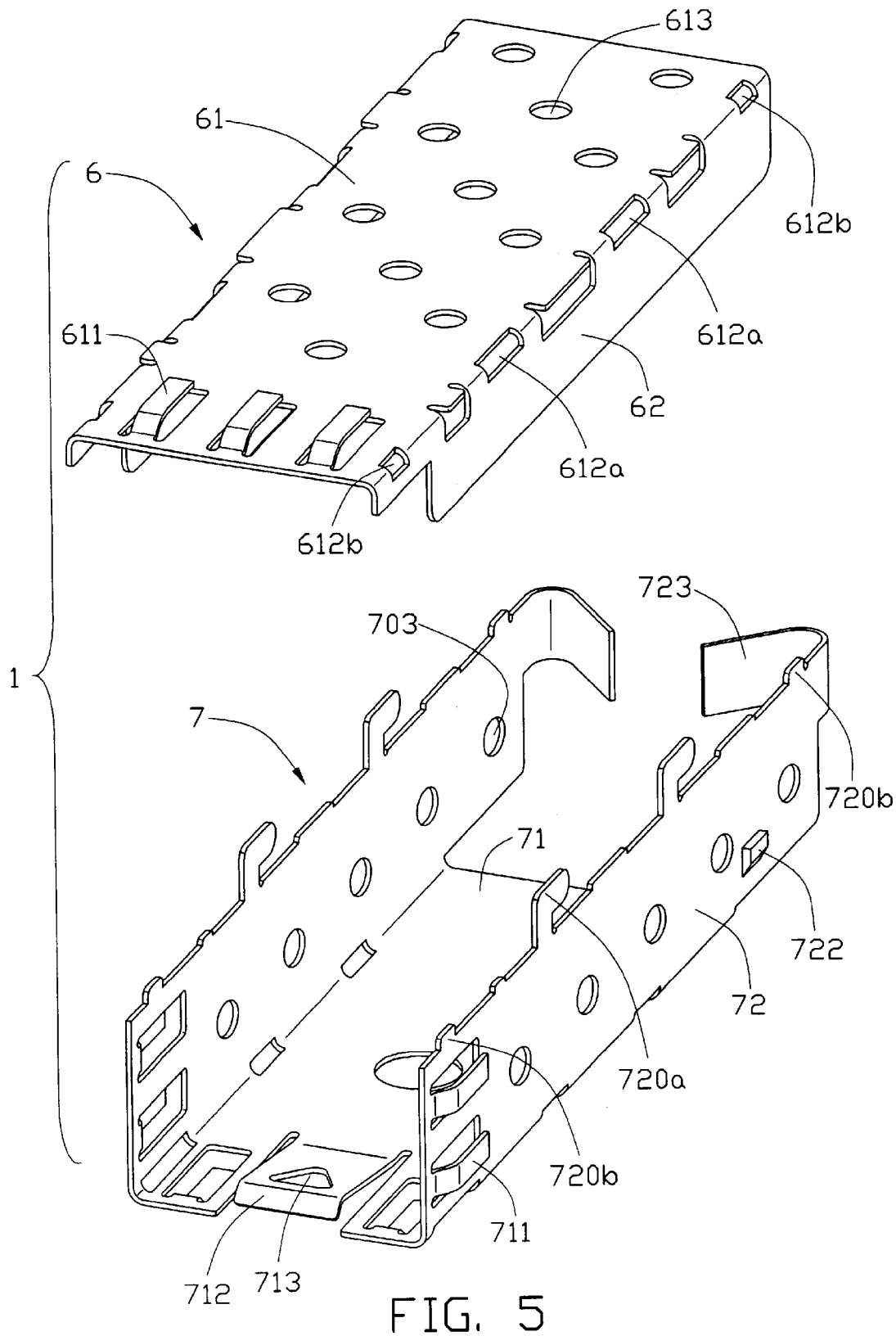
FIG. 5 is an exploded view of a transceiver cage of the shielding cage assembly of FIG. 1.

Referring to FIGS. 4 and 5, each transceiver cage 1 is made of electrically conductive material and includes an upper cage 6 and a body cage 7. The upper cage 6 includes a top wall 61 with two first side walls 62 extending downwardly therefrom. A plurality of through holes 613 is defined through the top wall 61 for heat-transmission during operation of the transceiver modules 4. A plurality of spring tabs 611 extends outwardly at an angle from a front end of the top wall 61 for EMI suppression. A plurality of slots 612a is defined at an intersection of the top wall 61 and each first side wall 62. A pair of cutouts 612b is respectively defined at a front end and at a rear end of each intersection. The body cage 7 includes a bottom wall 71 with two second side walls 72 extending upwardly therefrom. A width of the bottom cage 7 is a little less than that of the upper cage 6. A plurality of spring tabs 711 extends outwardly from a front end of the bottom wall 71 and the two second side walls 72. A releasing tab 712 extends inwardly at an angle from a middle of the front end of the bottom wall 71. A triangle shaped opening 713 is defined through the releasing tab 712 for engaging with a transceiver module 4 inserted into the transceiver cage 1. The releasing tab 712 can be depressed to remove the transceiver module 4 from the transceiver cage 1. Each second side wall 72 includes a plurality of retaining tabs 720a and a pair of projections 720b extending upwardly from its top edge. The retaining tabs 720a align with corresponding slots 612a in the upper cage 6 and each has an elbowed engaging portion. The projections 720b align with the corresponding cutouts 612b of the upper cage 6. A snap 722 extends outwardly from each of two said walls 72 to engage with a corresponding bottom shield 9. A pair of curved spring arms 723 extends forwardly and inwardly from a rear end of the second side walls 72. When the transceiver module 4 is inserted into the transceiver cage 1, the spring arms 723 are pressed and deform rearwardly. A plurality of through holes 703 is also defined through the bottom wall 71 and the two second side walls 72 for heat-transmission during operation of the transceiver modules 4. To remove the transceiver module 4 from the transceiver cage 1, the release tab 712 is depressed, and the spring arms 723 push the transceiver module 4 out of the transceiver cage 1.

To assemble the transceiver cage 1, the upper cage 6 engages with the body cage 7, the first side walls 62 overlie the second side walls 72, the retaining tabs 720a of the body cage 7 pass through the corresponding slots 612a of the upper cage 6, and the projections 720b are respectively soldered into the corresponding cutouts 612b in the upper cage 6. Thus the assembly of the transceiver cage 1 is completed.

Figure 3:
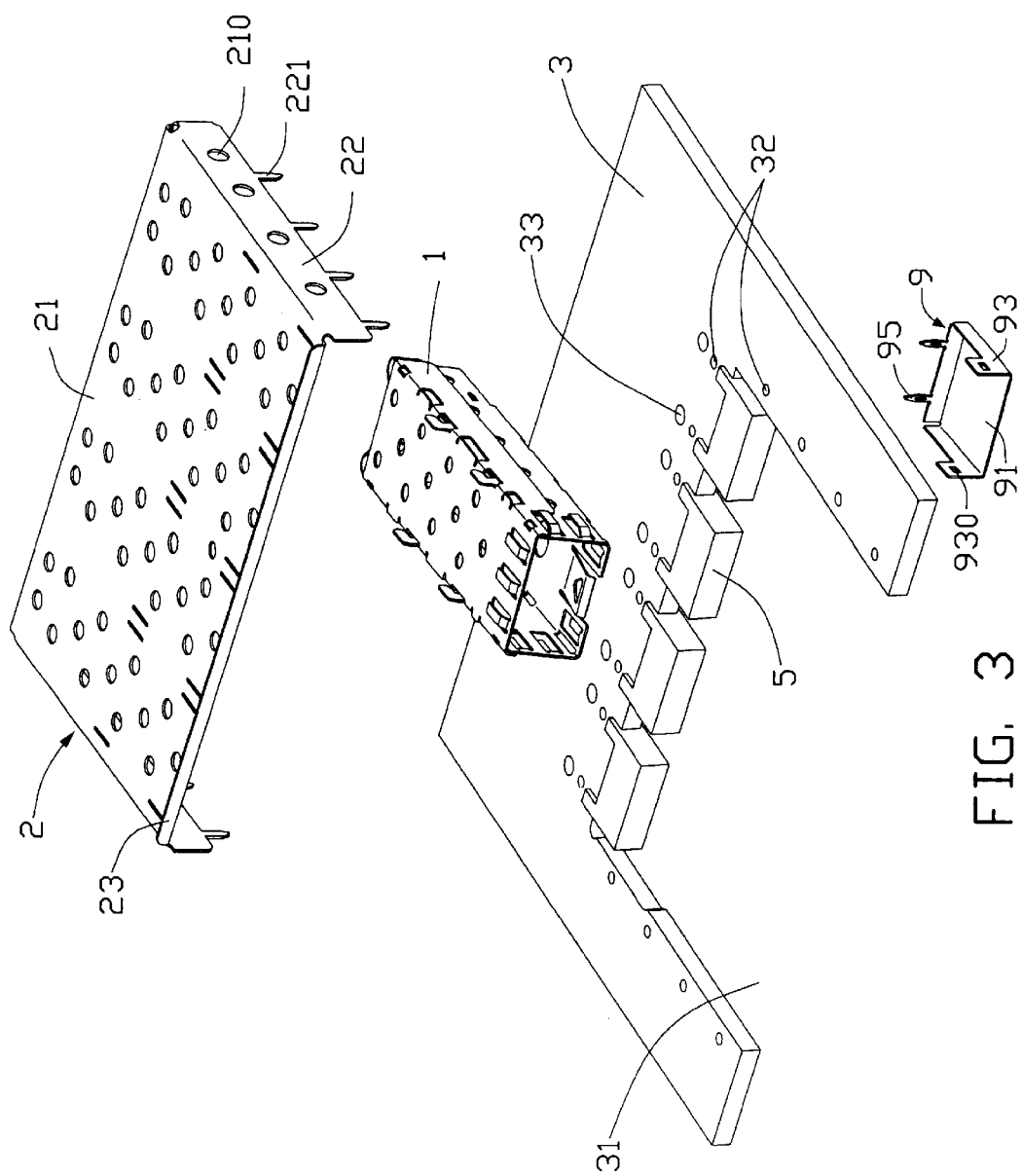
FIG. 3 is an exploded view of the shielding cage assembly with the printed circuit board (bottom shields not visible)

Referring to FIGS. 3 and 4, the connecting cover 2 is also made of electrically conductive material and includes a top plate 21 with two side plates 22, a front plate 23 and a back plate (not shown). The top plate 21 is flat and rectangular. A plurality of retaining slots 211 is defined through the top plate 21, arranged in parallel lines in a frontward to rearward direction. Each pair of retaining slots 211 corresponds to a pair of retaining tabs 720a extending from the two second side walls 72 of a transceiver cage 1. A width of the top plate 21 is larger than a sum of the widths of the plurality of the transceiver cages 1. This arrangement allows maintenance of a space between each two adjacent transceiver cages 1 when the transceiver cages 1 are retained to the connecting cover 2. The front plate 23 extends upwardly and vertically from a front end of the connecting cover 2 to enhance the strength of the connecting cover 2. The two side plates 22 and the back plate respectively extend downwardly from the top plate 21. A plurality of through holes 210 is defined through the top plate 21, the side plates 22, and the back plate for heat-transmission during operation of the transceiver modules 4. A plurality of mounting pins 221 extends downwardly from the side plates 22 and back plate.

To assemble the transceiver cages 1 to the connecting cover 2, the retaining tabs 720a of each transceiver cage 1 are inserted through the corresponding retaining slots 211 of the connecting cover 2, and then the transceiver cage 1 is fully pushed backward relative to the connecting cover 2. This leaves the front ends of the transceiver cages 1 exposed at a front of the connecting cover 2. The transceiver cages 1 are soldered to the connecting cover 2, completing assembly of the plurality of transceiver cages 1 to the connecting cover 2.

Referring to FIG. 3, the printed circuit board 3 defines a large, rectangular opening 31, a plurality of mounting holes 32 to three sides of the surrounding the opening 31, and a plurality of mounting holes 33 to a rear of the opening 31. A plurality of electrical connectors 5 is located at a rear end of the opening 31 of the circuit board 3. Electrical connectors 5 electrically connect to circuit in the circuit board 3.

Figure 2:
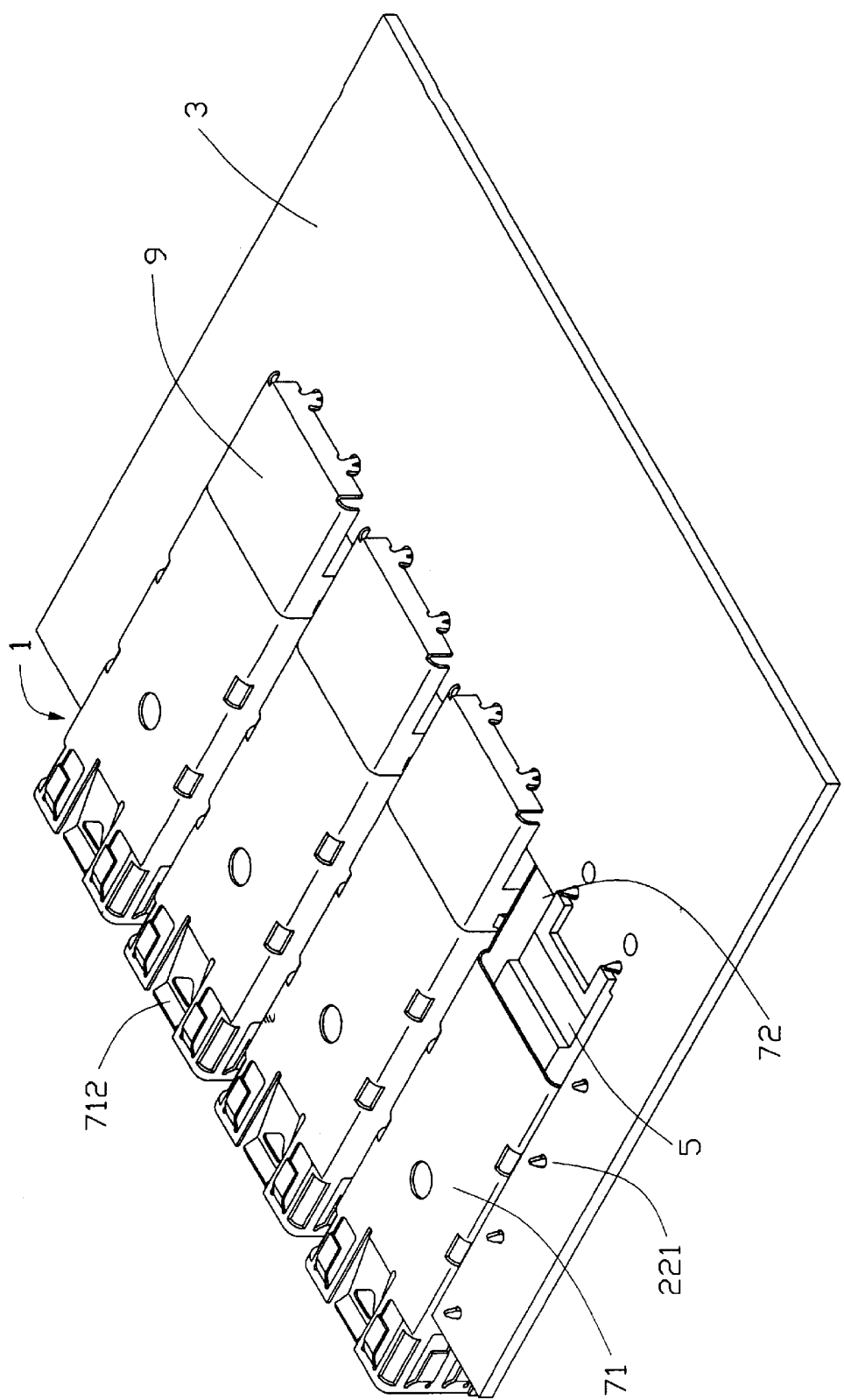
FIG. 2 is a bottom-side aspect view of FIG. 1 without the front panel.

Referring to FIGS. 2 and 3, each bottom shield 9 is made of electrically conductive material and includes a bottom wall 91 with two side walls 93 and a rear wall (not labeled) extending upwardly therefrom. A pair of cut-outs 930 is defined through the side walls 93 to receive the snaps 722 of a corresponding transceiver cage 1, and a pair of mounting pins 95 expends upwardly from an upper edge of the rear wall (not labeled). A needle-eye is defined in the middle of each mounting pin 95.

Referring back to FIGS. 1 and 2, the shielding cage assembly 100 is shown mounted to the printed circuit board 3. The mounting pins 221 of the connecting cover 2 are inserted through the corresponding mounting holes 32 of the circuit board 3. The transceiver cages 1 are received within the opening 31 of the circuit board 3, with bottoms of the transceiver cages 1 extending below the opening 31 of the circuit board 3. The front panel 8 defines a plurality of rectangular windows 81 therethrough. Front ends of the transceiver cages 1 respectively extend out of corresponding windows 81. The spring tabs 611, 711 of the transceiver cages 1 tightly fit against interior edges of the windows 81 for EMI suppression. Each of the electrical connectors 5 positioned at the rear edge of the opening 31 extends into a lower rear corner of a corresponding transceiver cage 1. The transceiver modules 4 are respectively inserted into corresponding transceiver cages 1, and are electrically engaged with the corresponding electrical connectors 5 on the printed circuit board 3. A rear end of the bottom portion of each transceiver cage 1 is electromagnetically unshielded that can be influenced by EMI. Each bottom shield 9 is attached to a lower side of the printed circuit board to covered a corresponding electrical connectors 5, with the mounting pins 95 being inserted through corresponding mounting holes 33 defined through the printed circuit board 3. The cut-outs 930 of the bottom shield 9 are lockingly engaged with the snaps 722 on the second side walls 72 of the corresponding transceiver cage 1. Thus, the bottom shields 9 are fixed to the printed circuit board 3 and are retained to the transceiver cages 1.

The shielding cage assembly 100 according to the present invention uses the connecting cover 2 to hold the plurality of transceiver cages 1 together. The assembly of the transceiver cages 1 to the circuit board 3 is simplified since the mounting pins 221 of the connecting cover 2 need only be inserted into the mounting holes 32 of the circuit board 3, to complete the attachment of the plurality of transceiver cages 1 to the printed circuit board 3. Furthermore, the bottoms of the transceiver cages 1 extend below the circuit board, so that the height of the shielding cage assembly 100 on the printed circuit board is can be minimized, resulting in a lower-profile mounting of the shielding cage assembled on the printed circuit board 3. Moreover, the bottom shields 9 when fixed to cover the unshielded, rear portion of the transceiver cage 1, the inserted transceiver modules 4 is shielding against EMI.

Although the present invention has been described with specific terms, it should be noted that the described embodiments are not necessarily exclusive, and that various changes and modifications may be made thereto without departing from the scope of the present invention as defined in the appended claims.

What is claimed is:

1. A shielding cage assembly for accommodating a plurality of transceiver modules therein and for mounting to a printed circuit board, comprising:
   a plurality of conductive transceiver cages, each for receiving a transceiver module therein;
   a conductive connecting cover; and
   a plurality of conductive bottom shields;
   wherein the transceiver cages attach beneath the connecting cover and being engagingly retained thereto, the connecting cover is fixed to the printed circuit board, so that, the transceiver cages extending through an opening in the printed circuit board and extend below a lower surface of the printed circuit board, and each of the bottom shield is fixed to the lower surface of the printed circuit board and to a bottom portion of a respective transceiver cage for increasing shielding of the transceiver cage against EMI.

2. The shielding cage assembly as described in claim 1, wherein said transceiver cages are arranged in parallel beneath the connecting cover.

3. The shielding cage assembly as described in claim 1, wherein a plurality of through holes is defined respectively through the transceiver cages and through the connecting cover for heat-transmission.

4. The shielding cage assembly as described in claim 1, wherein a space exists between each of two adjacent transceiver cages attached to the connecting cover.

5. The shielding cage assembly as described in claim 1, wherein a plurality of retaining tabs extended from the transceiver cages are engaging received in a corresponding slot defined through the connecting cover.

6. The shielding cage assembly as described in claim 1, wherein a plurality of mounting pins depend from the connecting cover.

7. The shielding cage assembly as described in claim 1, wherein each bottom shield includes a bottom wall, with two side walls, and a rear wall upwardly extending therefrom.

8. The shielding cage assembly as described in claim 7, wherein at least one mounting pin extends upwardly from the side walls or rear wall of each bottom shield.

9. The shielding cage assembly as described in claim 7, wherein the side walls of each bottom shield overlie corresponding transceiver cage, and a pair of cut-outs is defined in the side walls of the bottom shield to receive a corresponding pair of snaps defined on the transceiver cage.

10. A shielding assembly accommodating for electrical or optoelectronic subassembly and for mounting to a printed circuit board, comprising:

a conductive housing including a plurality of receptacles not totally shielded from one another and from an external environment to said housing, each receptacle receiving one of the optoelectronic or electrical subassemblies therein, a bottom corner of each receptacle being exposed to at a hole to said external environment; and a plurality of conductive bottom shields, each being engagingly retained to a corresponding receptacle and covering a corresponding said hole to improve EMI shielding of the housing.

11. The shielding assembly as described in claim 10, wherein said receptacles are separated with each other by a gap.

12. The shielding assembly as described in claim 10, wherein a plurality of through holes is defined in the housing.

13. The shielding assembly as described in claim 10, wherein an interengaging means includes a pair of snaps formed on at least a wall of each corresponding receptacle.

14. The shielding assembly as described in claim 13, wherein said interengaging means further includes a pair of cut-outs defining in each bottom shield to engage with corresponding snaps on the receptacle.

15. A shielding assembly comprising:

a printed circuit board defining opposite upper and bottom surfaces thereon and an opening vertically extending through said printed circuit board and recessed rearwardly from a front edge thereof;

at least one connector mounted to an interior edge of said printed circuit board, said interior edge being parallel to said front edge, said connector embedded in said opening instead of above said opening;

a conductive connecting cover mounted on the upper surface of said printed circuit board and vertically covering said opening and above said connectors;

at least one cage defining a cavity for receiving one corresponding module, the connector being received in the cavity; the cage defining at least two side walls with a bottom wall therebetween;

wherein
the bottom wall defines a cutout vertically aligned with the connector to facilitate vertically assembling the conductive connecting cover and the cage to the printed circuit board, and a conductive bottom shield is attached to the bottom surface of the printed circuit board to cover said cutout.

16. The assembly described in claim 15, wherein the cage further includes a top wall overlapped with the conductive connecting cover.

17. The assembly described in claim 15, wherein said conductive connecting cover and the cage are discrete from each other instead of being integrally formed with each other.

18. The assembly described in claim 15, wherein said bottom shield is substantially coplanar with the bottom wall.

* * * * *